United States Patent
Inaba

(10) Patent No.: US 7,986,575 B2
(45) Date of Patent: Jul. 26, 2011

(54) SEMICONDUCTOR MEMORY DEVICE AND REDUNDANCY METHOD THEREFOR

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 12/414,083

(22) Filed: Mar. 30, 2009

(65) Prior Publication Data

US 2010/0008125 A1 Jan. 14, 2010

(30) Foreign Application Priority Data

Jul. 8, 2008 (JP) ................. 2008-177798

(51) Int. Cl.
*G11C 29/00* (2006.01)
*G11C 7/00* (2006.01)

(52) U.S. Cl. ........ 365/200; 365/148; 365/158; 365/163; 365/175

(58) Field of Classification Search .................. 365/148, 365/158, 163, 175, 200
See application file for complete search history.

(56) References Cited

U.S. PATENT DOCUMENTS

| 6,400,600 B1 * | 6/2002 | Nickel et al. ................... 365/171 |
| 7,139,191 B1 * | 11/2006 | Bloomquist et al. .......... 365/158 |
| 7,505,337 B2 * | 3/2009 | Nowak et al. .................. 365/200 |
| 7,638,382 B2 * | 12/2009 | Murooka et al. ............... 438/197 |
| 2007/0047323 A1 * | 3/2007 | Murooka et al. .......... 365/185.23 |

FOREIGN PATENT DOCUMENTS

| JP | 2002-541613 | 12/2002 |
| WO | WO 00/62301 | 10/2000 |

* cited by examiner

*Primary Examiner* — VanThu Nguyen
(74) *Attorney, Agent, or Firm* — Oblon, Spivak, McClelland, Maier & Neustadt, L.L.P.

(57) ABSTRACT

A memory cell array is formed by arranging memory cells at intersections of plural first wirings and plural second wirings, and a rectifying element and a variable resistive element are connected in series in the memory cell. The variable resistive element has at least a first resistance value and a second resistance value that is higher than the first resistance value. The control circuit selectively drives the first wirings and the second wirings. The control circuit can perform a short-circuit failure countermeasure program operation. In the short-circuit failure countermeasure program operation, the variable resistive element of the memory cell whose rectifying element is in a short-circuit failure state is programmed from the first resistance value to the second resistance value.

19 Claims, 13 Drawing Sheets

VRow Driver 13

Column Switch 20

ONLY SELECTED BIT LINE BL IS SET AT VRESET, OTHER NONSELECTED BIT LINES BL ARE SET AT 0 V

Column decoder 21

Sense Amp & Write Buffer 22

VCol Driver 23

SEMICONDUCTOR MEMORY DEVICE AND REDUNDANCY METHOD THEREFOR

CROSS-REFERENCE TO RELATED APPLICATION

This application is based upon and claims the benefit of priority from prior Japanese Patent Application No. 2008-177798, filed on Jul. 8, 2008, the entire contents of which are incorporated herein by reference.

BACKGROUND OF THE INVENTION

1. Field of the Invention

The present invention relates to a semiconductor memory device, and a redundancy method therefor.

2. Description of the Related Art

In recent years, attention has been focused on resistive memories as successive candidates for flash memories. The resistive memory devices include a resistive memory (ReRAM: Resistive RAM) in a narrow sense, which uses a transition metal oxide as a recording layer to nonvolatilely store the resistance value state thereof, and a phase change memory (PCRAM: Phase Change RAM), which uses a chalcogenide or the like as a recording layer to utilize the resistance value information on the crystalline state (conductor) and the amorphous state (insulator).

A variable resistor in the resistive memory has been known to have two types of operation modes. One is designed to switch the polarity of the applied voltage to set a high-resistance state and a low-resistance state. This is referred to as the bipolar type. The other is designed to control the voltage value and the voltage applying time without switching the polarity of the applied voltage. This is referred to as the unipolar type.

The unipolar type is preferable to realize a high-density memory cell array. This is because in the unipolar type a variable resistor and a rectifier such as a diode can be stacked at an intersection of a bit line and a word line to configure a cell array with cross-point type memory cells with the use of no transistor. Further, such cell arrays can be stacked and arrayed three-dimensionally to realize a high capacity without increasing the cell array area (see JP 2002-541613 A).

In a cross-point type memory cell, a diode may become defective, and then the memory cell may fall into a short-circuited state. In this case, even when a memory cell other than the defective cell in the same memory cell array is selected for normal read or normal write operation, a current flows in the defective cell, preventing the read or write operation from performed normally. When such a defective cell is detected, there may be a case when the whole memory cell array including the defective cell must be dealt as a subject of redundancy replacement. In such a case, it is possible to decrease the area of one memory cell array to improve the redundancy remedy efficiency. In this case, however, there is a problem that the area of the memory cell array becomes large.

SUMMARY OF THE INVENTION

In an aspect the present invention provides a semiconductor memory device comprising: a memory cell array having memory cells arranged at intersections of a plurality of first wirings and a plurality of second wirings, a rectifying element and a variable resistive element being connected in series in the memory cell, the variable resistive element having at least a first resistance value and a second resistance value that is higher than the first resistance value; and a control circuit that selectively drives the first wirings and the second wirings, the control circuit being capable of performing a short-circuit failure countermeasure program operation in which the variable resistive element of the memory cell whose rectifying element is in a short-circuit failure state is programmed from the first resistance value to the second resistance value.

In another aspect the present invention provides a method for repairing redundancy of a semiconductor memory device including a memory cell array having memory cells arranged at intersections of a plurality of first wirings and a plurality of second wirings, a rectifying element and a variable resistive element being connected in series in the memory cell, the variable resistive element having at least a first resistance value and a second resistance value that is higher than the first resistance value, the redundancy repairing method comprising: detecting the memory cell whose rectifying element is in a short-circuit failure state; and programming the variable resistive element of the memory cell whose rectifying element is in a short-circuit failure state from the first resistance value to the second resistance value.

DETAILED DESCRIPTION OF THE EMBODIMENTS

An exemplary embodiment of the invention will be described below with reference to the accompanying drawings. A semiconductor memory device of the embodiment is described as a resistance-change memory device having a three-dimensional memory cell array structure in which memory cell arrays are laminated by way of example. However, the invention is not limited to the embodiment.

Figure 1:
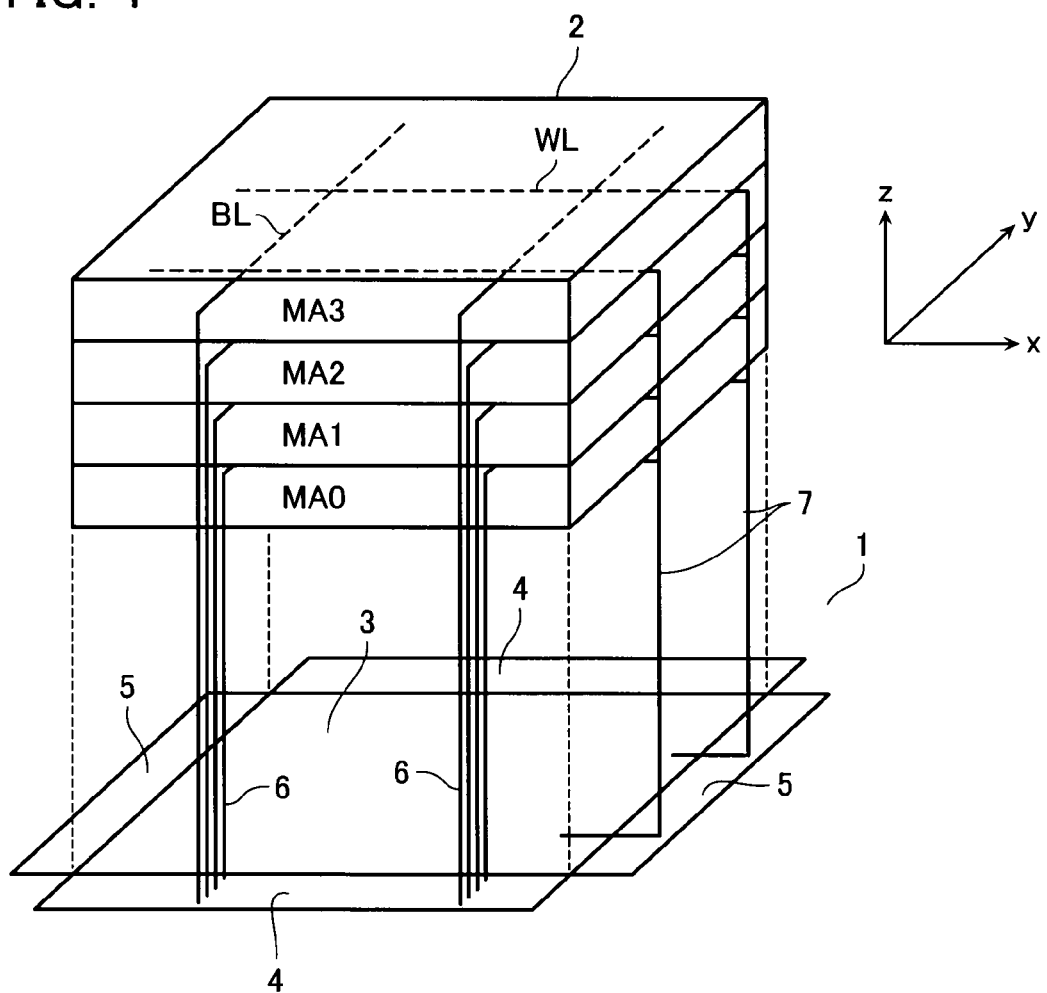
FIG. 1 is a perspective diagram showing the structure of the variable resistance memory device in accordance with the present embodiment of the present invention.

FIG. 1 illustrates a basic configuration of a resistance-change memory device according to an embodiment of the invention, that is, a configuration of a wiring region 3 in which a wiring such as a global bus is formed on a semiconductor substrate 1 and a configuration of a memory block 2 laminated on the wiring region 3.

Referring to FIG. 1, the memory block 2 includes four-layer memory cell arrays MA0 to MA3. The wiring region 3 is provided in the semiconductor substrate 1 immediately below the memory block 2. A global bus is provided in the wiring region 3 in order to exchange data written in and read from the memory block 2 with the outside. Further, a column control circuit including a column switch and a row control circuit including a row decoder may be provided in the wiring region 3.

A vertical wiring (via contact) is required in a side face of the memory block 2 in order to connect a word line WL and a bit line BL of each laminated memory cell array MA and the wiring region 3 formed on the semiconductor substrate 1. A bit line contact region 4 and a word line contact region 5 are provided in each of four sides of the wiring region 3. A bit line contact 6 and a word line contact 7 are formed in the bit line contact region 4 and word line contact region 5 in order to connect the bit line BL and word line WL and the control circuit. The word line WL is connected to the wiring region 3 through a word line contact 7. One end of the word line contact 7 is formed in the word line contact region 5. The bit line BL is connected to the wiring region 3 through the bit line contact 6. One end of the bit line contact 6 is formed in the bit line contact region 4.

FIG. 1 illustrates one memory block 2 in which plural memory cell arrays MA are laminated in a direction (z-direction shown in FIG. 1) perpendicular to the semiconductor substrate 1. Actually the plural unit memory blocks 2 are arranged in a matrix shape in a longitudinal direction (x-direction shown in FIG. 1) of the word line WL and a longitudinal direction (y-direction shown in FIG. 1) of the bit line BL. Single or plural metallic wiring layers may be disposed in the top of the memory cell array MA.

As illustrated in FIG. 1, in the word line contact region 5 of the embodiment, only one column contact is used. that is, the word lines WL in all the layers on one cross section are connected to the wiring region 3 through a common contact. In the bit line contact region 4, the bit lines BL of the layers are connected to the wiring region 3 through the separately-prepared four column contacts. In the embodiment, the bit line BL is independently driven in each layer while the word lines WL are commonly connected in all the layers. Alternatively, the word line WL may independently be driven in each layer, or the bit lines BL may commonly be connected in all the layers while the word line WL is independently driven in each layer. At least one of the bit line BL and word line WL may be shared by upper and lower layers.

Figure 2A:
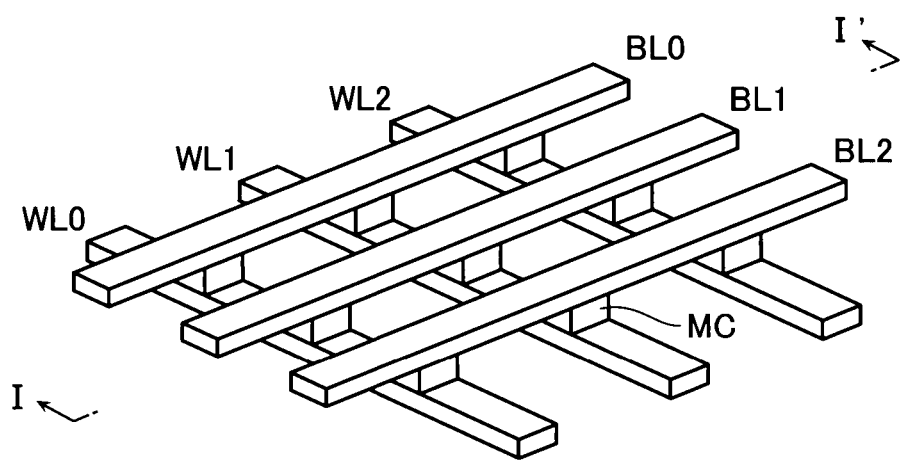
FIG. 2A is a perspective diagram of a part of the memory cell array 1.
Figure 2B:
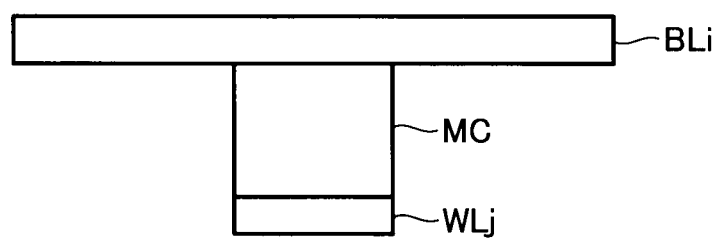
FIG. 2B is a cross-sectional view of one memory cell along I-I' line in FIG. 2A.

FIG. 2A is a perspective view illustrating a part of the memory cell array 1, and FIG. 2B is a sectional view of one memory cell taken on a line I-I' of FIG. 2A.

Plural word lines WL0 to WL2 are provided in parallel, plural bit lines BL0 to BL2 are provided in parallel so as to intersect the word lines WL0 to WL2, and a memory cell MC is disposed at each intersection so as to be sandwiched between the word line WL and the bit line BL.

Figure 2C:
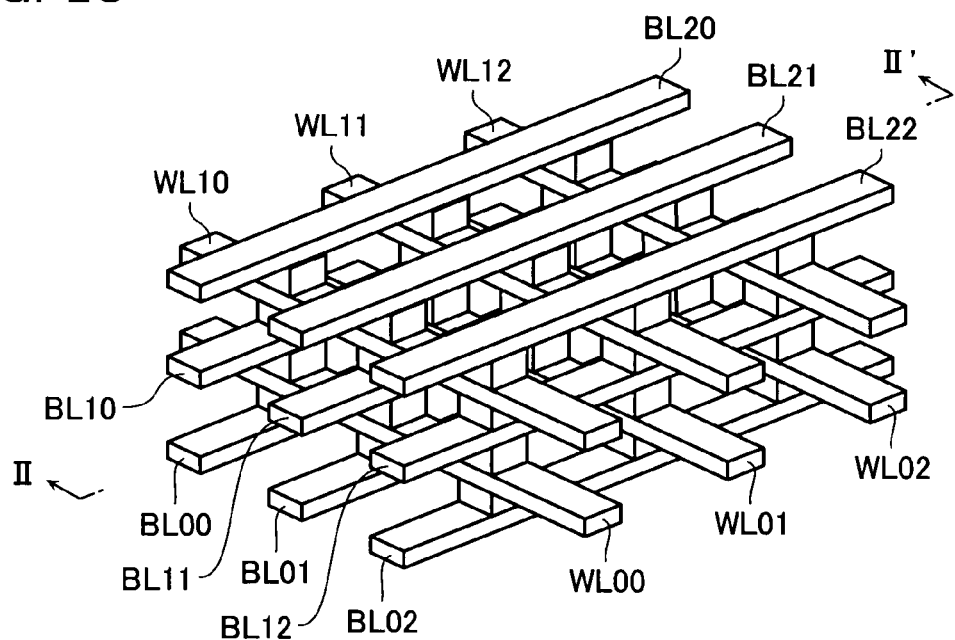
FIG. 2C is a perspective diagram showing another example of the structure of the memory cell array 1.
Figure 2D:
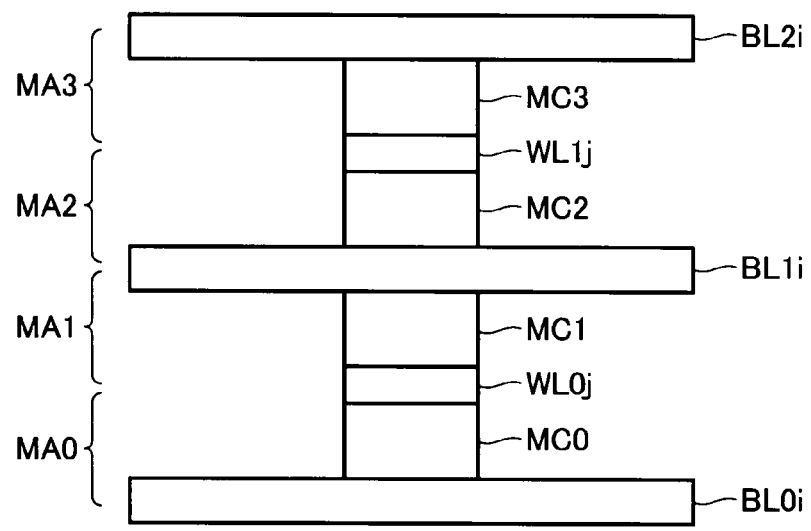
FIG. 2D is a cross-sectional view of one memory cell (four layers) in the II-II' line in FIG. 2C.

FIG. 2C is a perspective view illustrating another example of a configuration of the memory cell array 1, and FIG. 2D is a sectional view of one memory cell (four layers) taken on a line II-II' of FIG. 2C. FIGS. 2C and 2D illustrate a memory cell array MA having a four-layer structure including the memory cell array layers MA0 to MA3, one word line WL0$j$ is shared by memory cells MC1 and MC0 located above and below the word line WL0$j$, and one word line WL1$j$ is shared by memory cells MC3 and MC2 located above and below the word line WL1$j$. A bit line BL1$i$ is shared by memory cells MC2 and MC1 located above and below the bit line BL1$i$. The wiring structure can achieve the finer structure of the memory device.

Figure 2E:
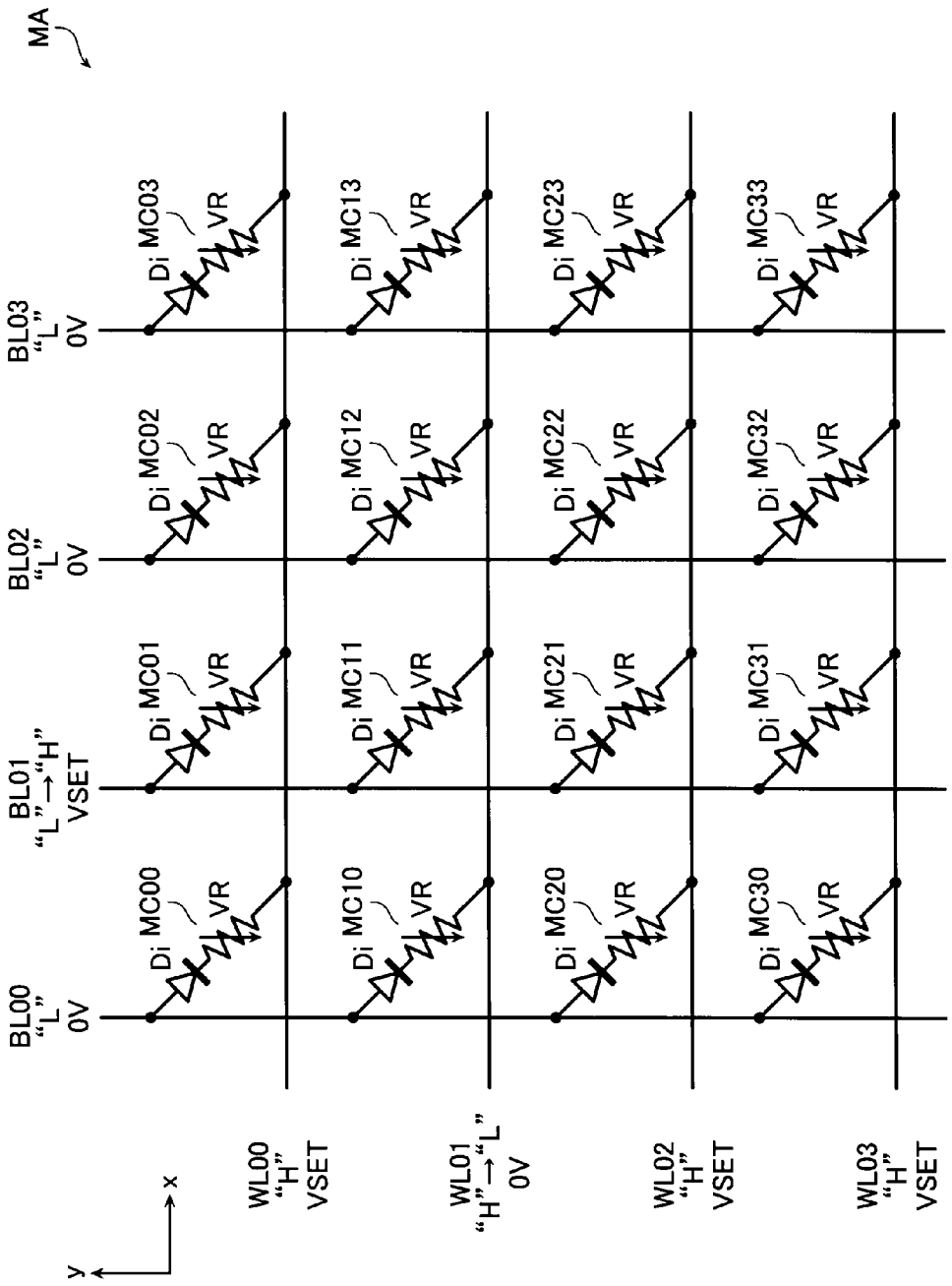
FIG. 2E is a circuit diagram showing as an example the equivalent circuit of the memory cell array of the variable resistance memory device according to the embodiment of the present invention.

FIG. 2E is a circuit diagram illustrating an equivalent circuit of the memory cell array MA of the resistance-change memory device. In the memory cell array MA of FIG. 2E, the plural unit memory cells MC are arrayed in a two-dimensional matrix shape in the longitudinal direction (y-direction shown in FIG. 2E) of the bit line BL and the longitudinal direction (x-direction shown in FIG. 2E) of the word line WL. As illustrated in FIG. 2E, the resistance-change type of unit memory cell MC is disposed at the intersection of the word line WL and the bit line BL, and a variable resistive element VR and a rectifying element such as a diode Di are connected in series. At this point, an arrangement and polarities of the diode Di and variable resistive element VR, which constitute the memory cell MC, are not limited to those of FIG. 2E. For example, a vertical relationship between the diode Di and the variable resistive element VR may be reversed. In addition to a normal diode, a Schottky diode or a Zener diode can be used as the diode Di.

For example, the variable resistive element VR has a structure of electrode/transition metal oxide/electrode. In the variable resistive element VR, a resistance value of a metal oxide is changed by a condition that a voltage, a current, thermal, and the like is applied, and different states of the resistance value are stored as information in a nonvolatile manner. More specifically, examples of the variable resistive element VR includes an element (PCRAM) in which the resistance value is changed by a phase transition between a crystalline state and an amorphous state like chalcogenide glass, a Conductive Bridging RAM (CBRAM) in which the resistance value is changed by depositing a metallic cation to form a contacting bridge between electrodes or by ionizing the deposited metal to break the contacting bridge, and an element (ReRAM) in which the resistance value is changed by voltage or current application. ReRAM is mainly divided into an element in which the resistance value is changed by the existence or nonexistence of charges trapped by a charge trap existing at an electrode interface and an element in which the resistance value is changed by the existence or nonexistence of a conductive path caused by an oxygen loss.

In the case of the unipolar ReRAM, the data is written in the memory cell MC by applying a voltage of 3.5 V (actually about 4.5 V when voltage drop of the diode Di is included) and a current of about 10 nA to the variable resistive element VR for about 10 ns to about 100 ns. Therefore, the variable resistive element VR is changed from a high-resistance state to a low-resistance state. Hereinafter the operation in which the variable resistive element VR is changed from the high-resistance state to the low-resistance state is referred to as setting operation.

On the other hand, a voltage of 0.8 V (actually about 1.8 V when the voltage drop of the diode Di is included) and a current of about 1 μA to about 10 μA is applied to the variable resistive element VR in the low-resistance state for about 500 ns to about 2 μs after the setting operation, thereby erasing the data from the memory cell MC. Therefore, the variable resistive element VR is changed from the low-resistance state to the high-resistance state. Hereinafter the operation in which the variable resistive element VR is changed from the low-resistance state to the high-resistance state is referred to as reset operation.

In the memory cell MC, the high resistance state is defined as a stable state (reset state). When binary data is stored therein, the data is written by the setting operation in which the reset state is changed to the low-resistance state.

A read operation of the memory cell MC is performed as follows: A voltage of 0.4 V (actually about 1.4 V when the voltage drop of the diode Di is included) is given to the variable resistive element VR, and a current flowing through the variable resistive element VR is monitored with a sense amplifier. Therefore, a determination is made whether the variable resistive element VR is in the low-resistance state or the high-resistance state. In cases where one memory cell MC can retain two-bit data, the sense amplifier produces three different reference voltages to compare the reference voltages to a cell signal.

The setting operation performed by the resistance-change memory device of the embodiment will be described with reference to FIG. 2E. FIG. 2E illustrates the states of the voltages applied to the bit line BL and word line WL, which are connected to the memory cell array MA during the setting operation of the memory cell MC. At this point, it is assumed that MC11 is the selected memory cell MC in which the data is written by the setting operation.

Non-selected bit lines BL00, BL02, and BL03 that are not connected to the selected memory cell MC11 are in an "L" state (in the embodiment, Vss=0 V). During the setting operation, the selected bit line BL01 connected to the selected memory cell MC11 is driven from the "L" state (Vss=0 V) to an "H" state (in the embodiment, voltage VSET). Non-selected word lines WL00, WL02, and WL03 that are not connected to the selected memory cell MC11 are in the "H" state (in the embodiment, voltage VSET). During the setting operation, the selected word line WL01 connected to the selected memory cell MC11 is driven from the "H" state (voltage VSET) to the "L" state (in the embodiment, voltage Vss=0 V). Therefore, the diode Di of the selected memory cell MC11 becomes a forward bias state to pass the current through the diode Di. A potential difference VSET is applied to the selected memory cell MC11 to change the variable resistive element VR from the high-resistance state to the low-resistance state, thereby completing the setting operation.

A state in which the voltage is applied to memory cells except for the selected memory cell MC11 during the setting operation will be described below. The voltage is not applied to both ends of each of the memory cells MC10, MC12, and MC13 that are connected to the intersections of the selected word line WL01 (applied voltage of 0 V) and the non-selected bit lines BL00, BL02, and BL03 (applied voltage of 0 V) of FIG. 2. Similarly the voltage is not applied to both ends of each of the memory cells MC01, MC21, and MC31 that are connected to the intersections of the selected bit line BL01 (applied voltage of VSET) and the non-selected word lines WL00, WL02, and WL03 (applied voltage of VSET).

On the other hand, a reverse bias is applied to the memory cells MC connected to the intersections of the non-selected bit lines BL00, BL02, and BL03 (applied voltage of 0 V) and the non-selected word lines WL00, WL02, and WL03 (applied voltage of VSET). However, because of the existence of the diode Di, only a small amount of leak current (about 0.1 nA) is normally flowing through the memory cells MC.

The following failures (1) to (3) are presumed for the failure of the memory cell in the resistance-change memory device:

(1) Although the diode does not fail, the variable resistive element has a failure of a short-circuit state (hereinafter referred to as short-circuit failure).
(2) One of or both the diode and the resistive element has a failure of an open-circuit state (hereinafter referred to as open-circuit failure).
(3) Although the variable resistive element does not fail, the diode has the short-circuit failure.

Even if the memory cell MC having the failure (1) is connected to the intersection of the non-selected bit line BL and the non-selected word line WL, because the diode prevents an increase in leak current, no problem is generated. Accordingly, the memory cell MC having the failure (1) has no influence on the read/write operation of the selected memory cell.

Even if the memory cell MC having the failure (2) is connected to the intersection of the non-selected bit line BL and the non-selected word line WL, the increase in leak current is not generated. Accordingly, the memory cell MC having the failure (2) has no influence on the read/write operation of the selected memory cell.

However, when the memory cell MC having the failure (3) is connected to the intersection of the non-selected bit line BL and the non-selected word line WL, the increase in leak current based on a reverse bias voltage cannot be prevented because of the short-circuit failure of the diode in the memory cell MC. The large leak current has an influence on the read/write operation of the selected memory cell, and sometimes the write/read operation cannot be performed. The influence is increased as the number of memory cells is increased in one memory cell array. Therefore, conventionally there is a limitation to the number of memory cells in one memory cell array.

In the embodiment, the memory cell MC having the failure (3) is detected, and a program operation (hereinafter the operation is referred to as "short-circuit failure countermeasure program operation") is performed such that the resistance value is increased in the variable resistive element VR of the memory cell MC having the failure (3). Therefore, the leak current can be reduced even if the short-circuit failure is generated in the diode Di. Accordingly, it is not necessary to reduce a scale of one memory cell array in order to improve redundancy repair efficiency, but the large scale can be achieved in one memory cell array to contribute to high integration of the memory device.

For example, in cases where ReRAM is used as the variable resistive element VR, the variable resistive element VR has a resistance value of about 10 kΩ in the low-resistance state while having the resistance value of about 100 MΩ in the high-resistance state, and a resistance ratio becomes about $10^4$ times. In cases where the variable resistive element VR has the resistance value of 100 MΩ in the high-resistance state, even if the voltage of 1 V is applied between both ends of the memory cell MC, the small current of about 10 nA flows through the memory cell MC. The current passing through the memory cell MC is much smaller than the write current or the read current, and the current passsing through the memory cell MC has a little influence on the write operation or the read operation. For example, the read current is about 100 μA when the data is read from the memory cell MC in the low-resistance state, and the read current becomes about $10^5$ times the current (10 nA) passing through the memory cell MC after the short-circuit failure countermeasure program operation.

Figure 3:
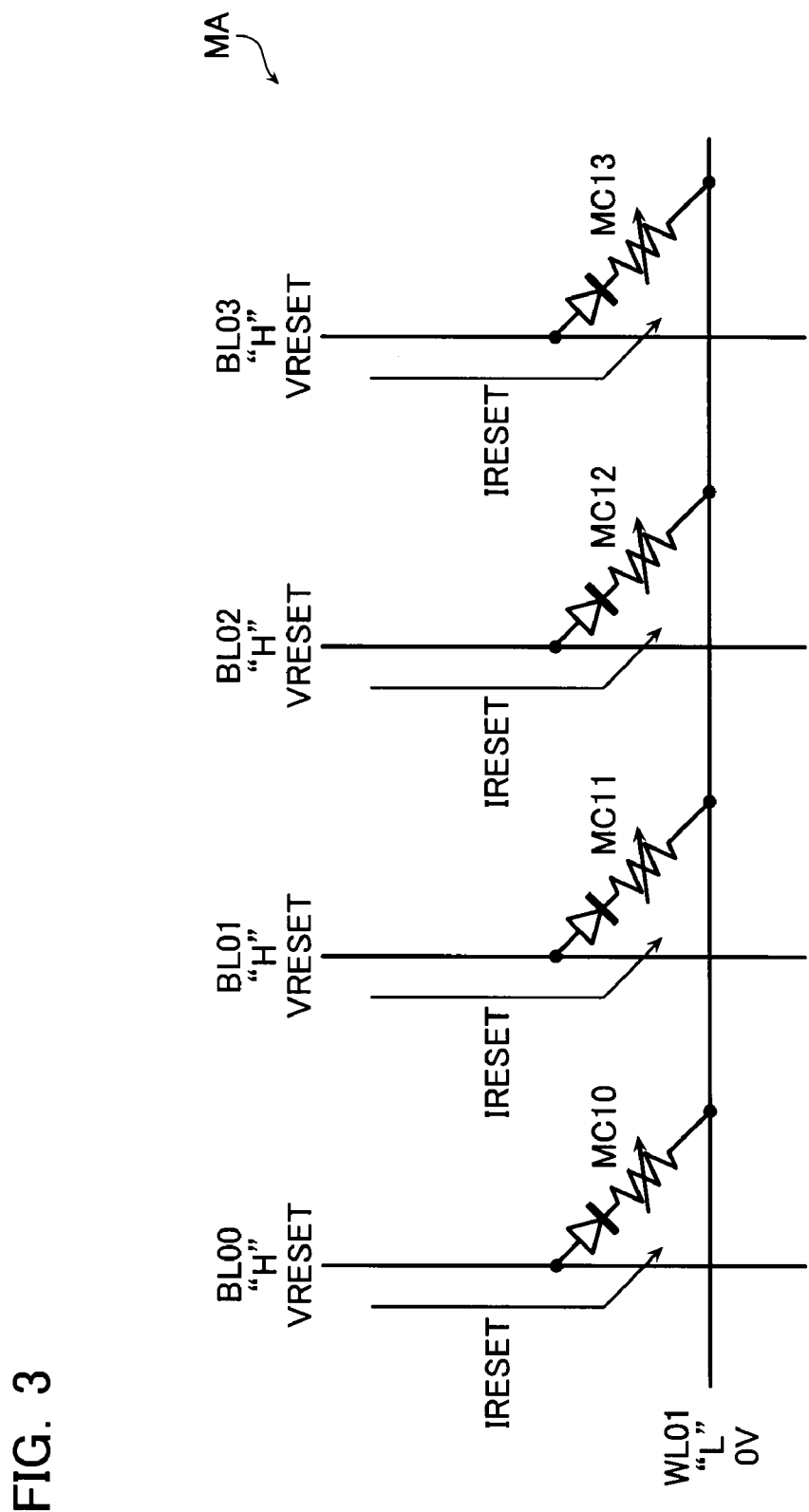
FIG. 3 is a conception diagram showing the reset operation of the variable resistance memory device.

The reset operation performed by the resistance-change memory device will be described with reference to FIG. 3.

During the reset operation, the selected bit lines BL00 to BL03 connected to the selected memory cells MC10 to MC13 are driven to the "H" state (in the embodiment, voltage VRESET). During the reset operation, the selected word line WL01 connected to the selected memory cell MC10 to MC13 is driven to the "L" state (in the embodiment, voltage Vss=0 V). At this point, the non-selected word lines WL00, WL02, and WL03 that are not connected to the selected memory cells MC10 to MC13 are in the "H" state (for example, voltage VRESET). The reset voltage VRESET applied to the bit lines BL00 to BL03 is a reference voltage that can change the variable resistive element VR of the memory cell MC from the low-resistance state to the high-resistance state.

The application of the voltage to the selected bit lines BL00 to BL03 causes the diodes Di of the selected memory cells MC10 to MC13 to become the forward bias state and the currents flow through the diodes Di. The reset current IRESET that can perform the reset operation flows through each memory cell MC. The reset voltage VRESET and reset current IRESET, which are applied to the bit lines BL00 to BL03, changes the variable resistive element VR from the low-resistance state to the high-resistance state to complete the reset operation.

[Configuration of Control Circuit]

Figure 4:
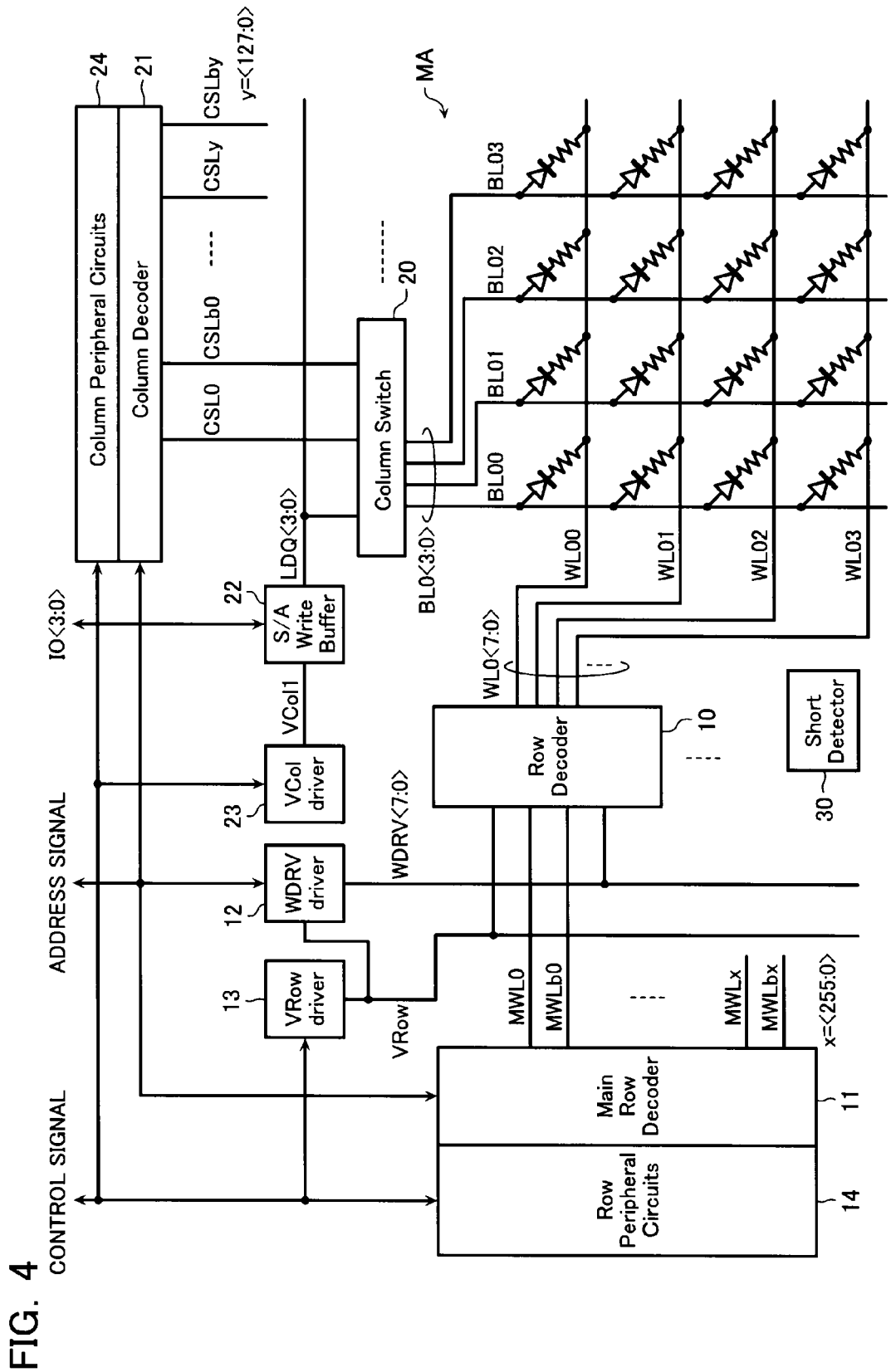
FIG. 4 is a block diagram showing as an example an arrangement of the column/row control circuit of the variable resistance memory device according to the embodiment of the present invention.

A circuit configuration of the resistance-change memory device will be described with reference to FIGS. 4 to 12. In the memory cell array MA of FIG. 4, for example, 2K-bit (2048) unit memory cells MC are arranged in the longitudinal direction of the bit line BL, and 512-bit unit memory cells MC are arranged in the longitudinal direction of the word line WL. Therefore, the case in which 1M-bit (about $10^6$) unit memory cells MC are arranged in the one memory cell array MA will be described by way of example. FIG. 4 is a block diagram illustrating an example of the arrangement of a column control circuit and a row control circuit in the resistance-change memory device.

Referring to FIG. 4, the row control circuit includes a row decoder 10, a main row decoder 11, a write drive line driver 12, a row power supply line driver 13, and a row-system peripheral circuit 14. The column control circuit includes a column switch 20, a column decoder 21, a sense amplifier/write buffer 22, a column power supply line driver 23, and a column-system peripheral circuit 24. The resistance-change memory device includes a short-circuit failure detecting circuit 30 that detects the short-circuit failure of the memory cell MC.

The word line WL of the embodiment has a hierarchical structure, and the main row decoder 11 selectively drives one of 256 pairs of main word lines MWLx and MWLbx (x=<255:0>). For example, in the selected main word lines MWLx and MWLbx, the main word line MWLx becomes the "H" state and the main word line MWLbx becomes the "L" state. On the contrary, in the non-selected main word lines MWLx and MWLbx, the main word line MWLx becomes the "L" state and the main word line MWLbx becomes the "H" state. One pair of main word lines MWLx and MWLbx is connected to one row decoder 10. The row decoder 10 selectively drives one of eight word lines WL included in a word line group WLx<7:0>. The word line group WLx<7:0> is located under the hierarchy of the main word lines MWLx and MWLbx. The row decoder 10 connected to the main word lines MWLx and MWLbx selectively driven by the main row decoder 11 further selectively drives the word line WL, thereby selectively driving one word line WL.

Eight write drive lines WDRV<7:0> and row power supply line VRow are connected to the write drive line driver 12, and the row power supply line VRow is connected to the row power supply line driver 13. The write drive lines WDRV<7:0> and the row power supply line VRow are connected to the row decoder 10. The voltage is applied to the write drive line WDRV<7:0> and the row power supply line VRow in order that the row decoder 10 drives the word line WL. Specifically, during the reset operation, the voltage Vss (=0 V) is supplied to one write drive line WDRV corresponding to the selected word line WL in the eight write drive lines WDRV<7:0>, and the voltage VRESET is supplied to other write drive lines WDRV of the write drive lines WDRV<7:0>. The voltage (VRESET) supplied to the word line WL under the hierarchy of the non-selected main word line MWL and MWLbx is applied to the row power supply line VRow.

The row-system peripheral circuit 14 manages the whole of the resistance-change memory device. The row-system peripheral circuit 14 receives a control signal from an external host apparatus, the row-system peripheral circuit 14 reads, write, and erases the data, and the row-system peripheral circuit 14 performs data input and output management.

The bit line BL of the embodiment also has the hierarchical structure, and the column decoder 21 selectively drives plural pairs of column selection lines CSLy and CSLby in 128 pairs of column selection lines CSLy and CSLby (y=<127:0>). For example, in the selected column selection lines CSLy and CSLby, the column selection line CSLy becomes the "H" state and the column selection line CSLby becomes the "L" state. On the contrary, in the non-selected column selection lines CSLy and CSLby, the column selection line CSLy becomes the "L" state and the column selection line CSLby becomes the "H" state.

One pair of column selection lines CSLy and CSLby is connected to one column switch 20. The column switch 20 selectively drives a bit line group BLy<3:0> including four bit lines BL located under the hierarchy of the column selection lines CSLy and CSLby. The column switch 20 that is connected to the column selection lines CSLy and CSLby selectively driven by the column decoder 21 further selectively drives the bit line BL, thereby selectively driving the bit line BL.

Four local data lines LDQ<3:0> are connected to the sense amplifier/write buffer 22. The local data lines LDQ<3:0> are connected to the column switch 20. The sense amplifier/write buffer 22 detects and amplifies signals read on the local data lines LDQ<3:0>, and the sense amplifier/write buffer 22 supplies the write data fed from data input and output lines IO<3:0> to the memory cell MC through the column switch 20. The voltage is applied to the local data line LDQ<3:0> in order that the column switch 20 drives the bit line BL. The column power supply line driver 23 is connected to the sense amplifier/write buffer 22 through a column power supply line VColl.

The column-system peripheral circuit 24 manages the whole of the resistance-change memory device. The column-system peripheral circuit 24 receives a control signal from an external host apparatus, the column-system peripheral circuit 24 reads, write, and erases the data, and the column-system peripheral circuit 24 performs data input and output management.

The detailed configuration of the row control circuit will be described with reference to FIGS. 5 to 8. FIGS. 5 to 8 are circuit diagrams illustrating an example of the configuration of the row control circuit in the resistance-change memory device.

[Configuration of Row Decoder 10]

Figure 5:
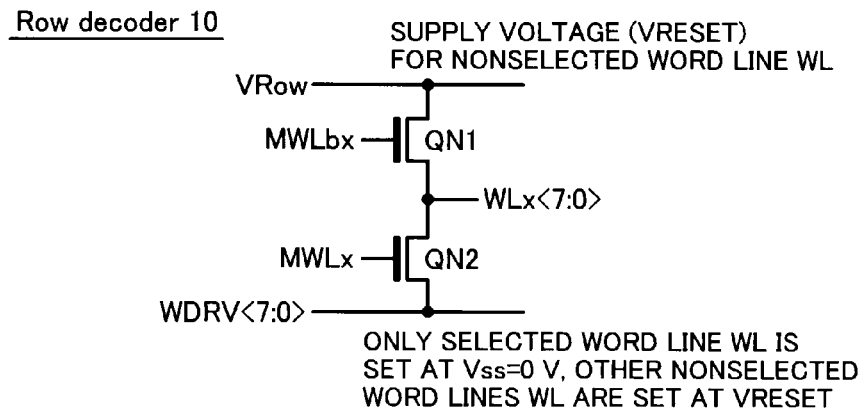
FIG. 5 is a circuit diagram showing as an example the structure of the row control circuit of the variable resistance memory device according to the embodiment of the present invention.

As illustrated in FIGS. 4 and 5, one of the 256 pairs of main word lines MWLx and MWLbx (x=<255:0>), the row power supply line VRow, and the write drive lines WDRV<7:0> are connected to the row decoder 10. The word line group WLx<7:0> is connected to the row decoder 10, and the word line group WLx<7:0> is connected to the plural memory cells MC that are arrayed in line. As described above, the word line group WLx<7:0> connected to the one row decoder 10 includes the eight wirings of word line WLx0 to word line WLx7. Similarly the write drive lines WDRV<7:0> are the eight wirings WDRV0 to WDRV7.

As illustrated in FIG. 5, the row decoder 10 includes eight transistor pairs each of which sources of two NMOS transistors QN1 and QN2 are connected to each other. The main word line MWLbx is connected to a gate of the transistor QN1 and the row power supply line VRow is connected to a drain of the transistor QN1. The main word line MWLx is connected to the gate of the transistor QN2 and one of the write drive lines WDRV<7:0> is connected to the drain of the transistor QN2. The sources of the transistors QN1 and QN2 are connected to one of the word lines WL included in the word line group WLx<7:0>

[Configuration of Main Row Decoder 11]

Figure 6:
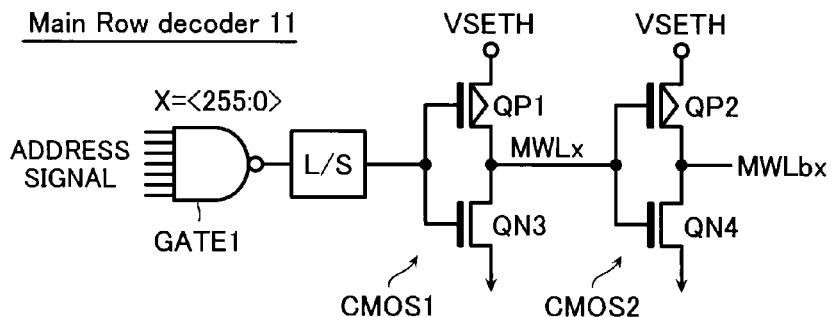
FIG. 6 is a circuit diagram showing as an example the structure of the row control circuit of the variable resistance memory device according to the embodiment of the present invention.

As illustrated in FIGS. 4 and 6, 256 pairs of main word lines MWLx and MWLbx (x=<255:0>) and an address signal line are connected to the main row decoder 11. The word line WL of the resistance-change memory device of the embodiment has the hierarchical structure. The main row decoder 11 is a pre-decoder. One set of main word lines MWLx and MWLbx is connected to eight transistor pairs (QN1 and QN2 of FIG. 5) in one row decoder 10, and one row decoder 10 can select one of the eight word lines WLx<7:0>. The main row decoder 11 includes a circuit of FIG. 6 in each set of main word lines MWLx and MWLbx.

As illustrated in FIG. 6, in one main row decoder 11, the address signal line connected to the main row decoder 11 is connected to a logic gate GATE1. An output signal of the logic gate GATE1 is supplied to an input terminal of a CMOS inverter CMOS1 through a level shifter L/S. The CMOS inverter CMOS1 includes a PMOS transistor QP1 and an NMOS transistor QN3. A power supply VSETH is connected to the source of the transistor QP1, and the source of the transistor QN3 is grounded. The drains of the transistors QP1 and QN3 are connected to the main word line MWLx.

The main word line MWLx is connected to a CMOS inverter CMOS2. The CMOS inverter CMOS2 includes a PMOS transistor QP2 and an NMOS transistor QN4. The power supply VSETH is also connected to the source of the transistor QP2 and the source of the transistor QN4 is grounded. The drains of the transistors QP2 and QN4 are connected to the main word line MWLbx.

[Configuration of Write Drive Line Driver 12]

Figure 7:
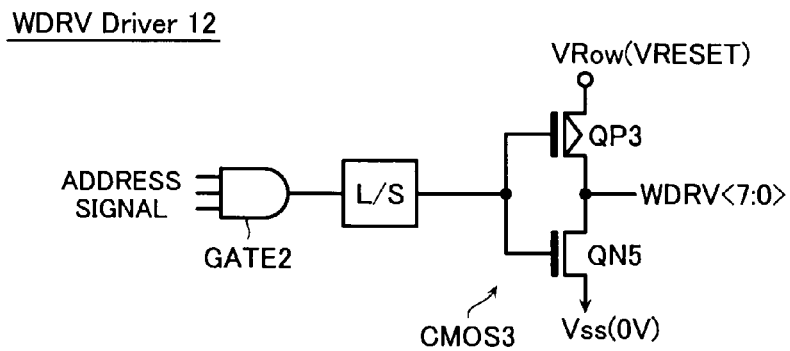
FIG. 7 is a circuit diagram showing as an example the structure of the row control circuit of the variable resistance memory device according to the embodiment of the present invention.

As illustrated in FIGS. 4 and 7, the row power supply line VRow and the address signal line are connected to the write drive line driver 12. At this point, the write drive line driver 12 is also a pre-decoder.

The address signal line connected to the write drive line driver 12 is connected to a logic gate GATE2. An output signal of the logic gate GATE2 is supplied to an input terminal of a CMOS inverter CMOS3 through a level shifter L/S. The CMOS inverter CMOS3 includes a PMOS transistor QP3 and an NMOS transistor QN5. The row power supply line VRow to which the voltage VRESET is applied as described later is connected to the source of the transistor QP3, and the source of the transistor QN5 is grounded. The drains of the transistors QP3 and QN5 are connected to the write drive lines WDRV<7:0>.

[Configuration of Row Power Supply Line Driver 13]

Figure 8:
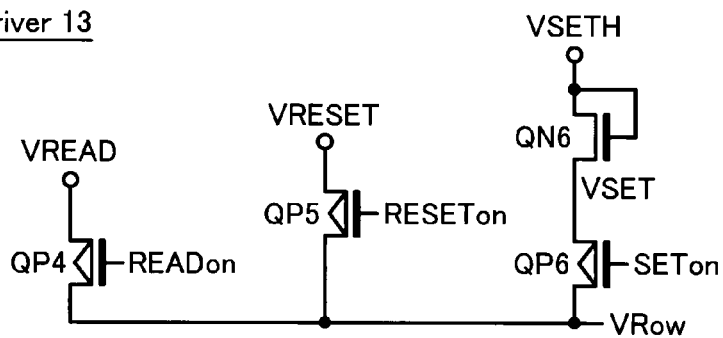
FIG. 8 is a circuit diagram showing as an example the structure of the row control circuit of the variable resistance memory device according to the embodiment of the present invention.

As illustrated in FIGS. 4 and 8, the row power supply line VRow and a control signal line are connected to the row power supply line driver 13. In the row power supply line driver 13, the power supply VSETH is connected to the drain and gate of the NMOS transistor QN6. The source of the transistor QN6 is connected to the row power supply line VRow through a PMOS transistor QP6. A control signal SETon is supplied to the gate of the transistor QP6.

In the row power supply line driver 13, the power supply VREAD is connected to the row power supply line VRow through a PMOS transistor QP4, and the power supply VRESET is connected to the row power supply line VRow through a PMOS transistor QP5. A control signal READon is supplied to the gate of the transistor QP4, and a control signal RESETon is supplied to the gate of the transistor QP5. The control signals READon and RESETon are changed from the "H" state to the "L" state in reading the data and in the reset operation, respectively.

A detailed configuration of the column control circuit will be described with reference to FIGS. 9 to 12. FIGS. 9 to 12 are circuit diagrams illustrating an example of the configuration of the column control circuit in the resistance-change memory device.

[Configuration of Column Switch 20]

Figure 9:
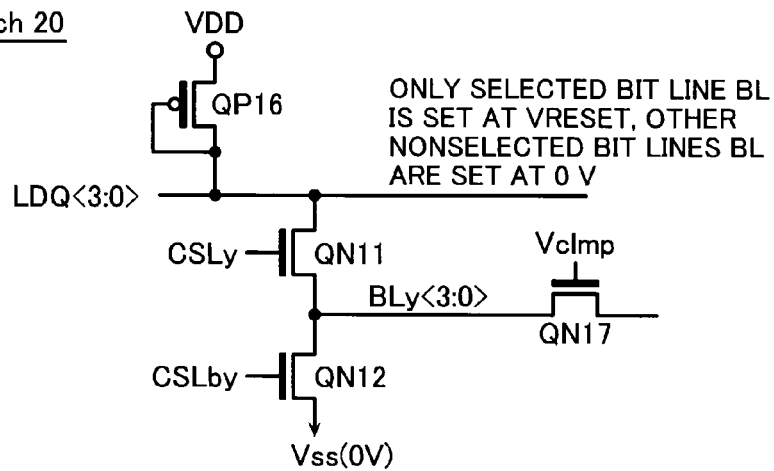
FIG. 9 is a circuit diagram showing as an example the structure of the column control circuit of the variable resistance memory device according to the embodiment of the present invention.

As illustrated in FIGS. 4 and 9, one of the 128 pairs of column selection lines CSLy and CSLby (y=<127:0>) and local data lines LDQ<3:0> are connected to the column switch 20. The bit line group BLy<3:0> is connected to the column switch 20, and the bit line group Bly<3:0> is connected to the plural memory cells MC that are arranged in line. As described above, the bit line group BLy<3:0> connected to one column switch 20 includes the four wirings of bit line Bly0 to bit line BLy3. Similarly the local data lines LDQ<3:0> are the four wirings LDQ0 to LDQ3.

As illustrated in FIG. 9, the column switch 20 four pairs of transistors each of which sources of two NMOS transistors QN11 and QN12 are connected to each other. The column selection line CSLy is connected to the gate of the transistor QN11, and one of the local data lines LDQ<3:0> is connected to the drain of the transistor QN11. The column selection line CSLby is connected to the gate of the transistor QN12, and the drain of the transistor QN12 is grounded. The sources of the transistors QN11 and QN12 are connected to one of the bit lines BL included in the bit line group BLy<3:0>. A limit transistor QN17 is connected to each of the bit lines BLy<3:0>. A limit voltage Vclmp is given to the gate of the limit transistor QN17. The limit transistor QN17 limits the voltages at the bit lines BLy<3:0> to the neighborhood of a voltage (Vclmp−Vth) that is lower than the limit voltage Vclmp by a threshold voltage Vth of the limit transistor QN17.

A drain of a diode-connected PMOS transistor QP16 is connected to the local data lines LDQ<3:0>. The diode-connected PMOS transistor QP16 acts as a constant-current circuit (current source load transistor) that supplies a constant current to the memory cell MC. The constant current supplied from the PMOS transistor QP16 flows through the memory cell MC, thereby generating a voltage Vcell in the local data lines LDQ<3:0> according to the data retained by the memory cell MC. A sense amplifier circuit compares the voltage Vcell to a reference voltage to determine the data retained by the memory cell MC.

[Configuration of Column Decoder 21]

Figure 10:
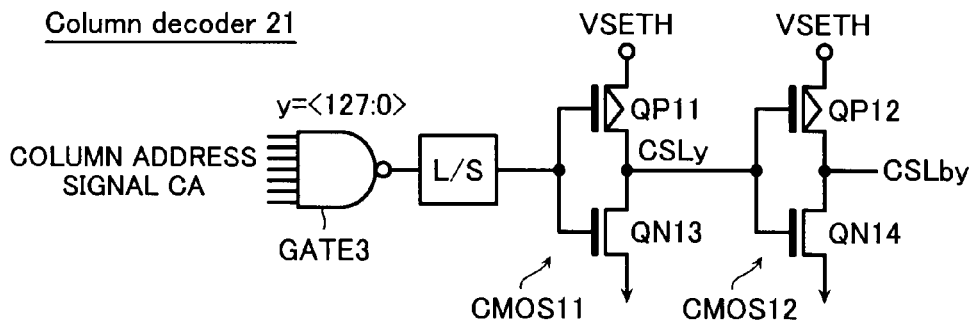
FIG. 10 is a circuit diagram showing the structure of the column control circuit of the variable resistance memory device according to the embodiment of the present invention.

As illustrated in FIGS. 4 and 10, the 128 pairs of column selection lines CSLy and CSLby (y=<127:0>) and the address signal line into which a column address signal CA is fed are connected to the column decoder 21. In the resistance-change memory device of the embodiment, one set of column selection lines CSLy and CSLby is connected to four transistor pairs (QN11 and QN12 of FIG. 9) in one column switch 20, and one column switch 20 selectively drives four bit line groups Bly<3:0>. The column decoder 21 includes a circuit of FIG. 10 in each pair of column selection lines CSLy and CSLby.

As illustrated in FIG. 10, in one column decoder 21, the address signal line connected to the column decoder 21 is connected to a logic gate GATE3. An output signal of the logic gate GATE3 is supplied to an input terminal of a CMOS inverter CMOS11 through a level shifter L/S. The CMOS inverter CMOS11 includes a PMOS transistor QP11 and an NMOS transistor QN13. The power supply VSETH is connected to the source of the transistor QP11 and the source of the transistor QN13 is grounded. The drains of the transistors QP11 and QN13 are connected to the column selection line CSLy.

The column selection line CSLy is connected to a CMOS inverter CMOS12. The CMOS inverter CMOS12 includes a PMOS transistor QP12 and an NMOS transistor QN14. The power supply VSETH is also connected to the source of the transistor QP12, and the source of the transistor QN14 is grounded. The drains of the transistors QP12 and QN14 are connected to the column selection line CSLby.

[Configuration of Sense Amplifier/Write Buffer 22]

Figure 11:
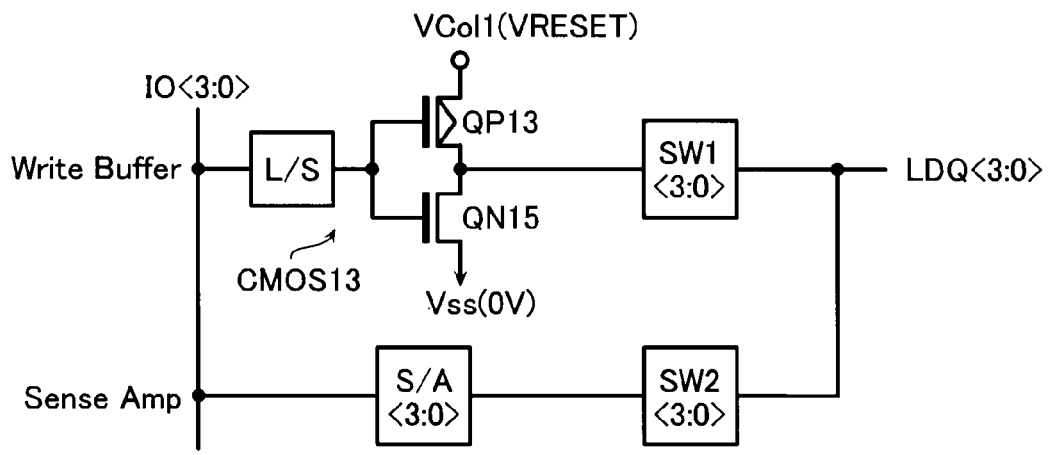
FIG. 11 is a circuit diagram showing as an example the structure of the column control circuit of the variable resistance memory device according to the embodiment of the present invention.

As illustrated in FIGS. 4 and 11, the column power supply line VColl, the local data lines LDQ<3:0>, and the data input and output lines IO<3:0> are connected to the sense amplifier/write buffer 22. A configuration of the write buffer portion will be described below. The data input and output lines IO<3:0> connected to the sense amplifier/write buffer 22 are connected to a CMOS inverter CMOS13 through a level shifter L/S. The CMOS inverter CMOS13 includes a PMOS transistor QP13 and an NMOS transistor QN15. The column power supply line VColl is connected to the source of the transistor QP13. The reset voltage VRESET is applied to the column power supply line VColl as described later. The source of the transistor QN15 is grounded. The drains of the transistors QP13 and QN15 are connected to the local data lines LDQ<3:0> through a switch SW1.

Then a sense amplifier portion will be described below. The data input and output lines IO<3:0> connected to the sense amplifier/write buffer 22 are connected to a sense amplifier S/A. As described later, the sense amplifier S/A compares a reference voltage to a voltage generated on the local data line LDQ by the current flowing through the selected memory cell. A reference voltage generating circuit (not shown in FIG. 11) produces the reference voltage. An output terminal of the sense amplifier S/A is connected to the local data lines LDQ<3:0> through a switch SW2.

[Configuration of Column Power Supply Line Driver 23]

Figure 12:
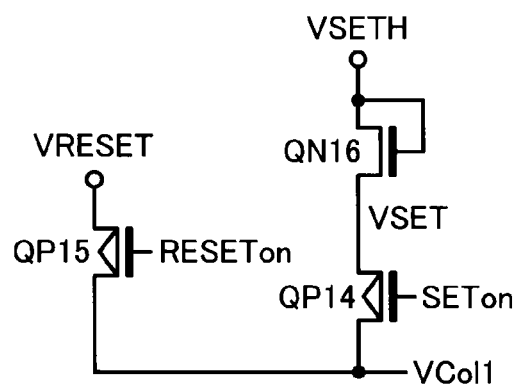
FIG. 12 is a circuit diagram showing as an example the structure of the column control circuit of the variable resistance memory device according to the embodiment of the present invention.

As illustrated in FIGS. 4 and 12, the column power supply line VColl and the control signal line are connected to the column power supply line driver 23. In the column power supply line driver 23, the power supply VSETH is connected to a drain and a gate of an NMOS transistor QN16, and a source of the transistor QN16 is connected to the column power supply line VColl through a PMOS transistor QP14. The control signal SETon is supplied to the gate of the transistor QP14.

In the column power supply line driver 23, the power supply VRESET is connected to the column power supply line VColl through a PMOS transistor QP15. The control signal RESETon is supplied to the gate of the transistor QP15. The control signal RESETon is changed from the "H" state to the "L" state in the reset operation.

[Configuration of Short-Circuit Failure Detecting Circuit 30]

An example of the configuration of the short-circuit failure detecting circuit 30 will be described with reference to FIG. 13.

The short-circuit failure detecting circuit 30 includes a differential amplifier 31, a voltage-limiting transistor QN20, a bit line connecting transistor QN21, a word line connecting transistor QN22, and a current detecting circuit 33.

A reference voltage VREF is given to one of input terminals of the differential amplifier 31, and a common line COMY is connected to the other input terminal. The common line COMY is connected to the plural bit lines BL through the plural bit line connecting transistors QN21, respectively. Switching signals Y<0> to Y<3> are given to the gates of the bit line connecting transistors QN21 to bring the bit line connecting transistors QN21 into conduction. The voltage-limiting transistor QN20 is connected between the common line COMY and a ground terminal, and a limit voltage VLMT is supplied to the gate of the voltage-limiting transistor QN20. Therefore, the voltage-limiting transistor QN20 limits a potential at the common line COMY to a predetermined value or less.

A common line COMX is connected to the plural word lines WL through the plural word line connecting transistors QN22, respectively. Switching signals X<0> to X<3> are given to the gates of the bit line connecting transistors QN22 to bring the bit line connecting transistors QN22 into conduction. The current detecting circuit 33 is operated after the word line connecting transistors QN22 are brought into conduction, and the current detecting circuit 33 detects an amount of current flowing through the common line COMX.

The operation of the short-circuit failure detecting circuit 30 will be described below. Rectifying action of the diode Di is eliminated in the memory cell MC in which the short circuit of the diode Di is generated. Therefore, when a reverse bias is applied to the memory cell MC (that is, a high potential is applied to the word line WL while a low potential is applied to the bit line BL, thereby applying the reverse bias to the diode Di) to measure whether the current flows, the short-circuit failure memory cell MC can be specified. Alternatively, the reverse bias may be applied to the memory cell MC to detect whether a potential at the word line WL is lowered. Alternatively, whether a potential at the bit line BL is raised may be detected, or both whether the potential at the word line WL is lowered and whether the potential at the bit line BL is raised may be detected.

Figure 13:
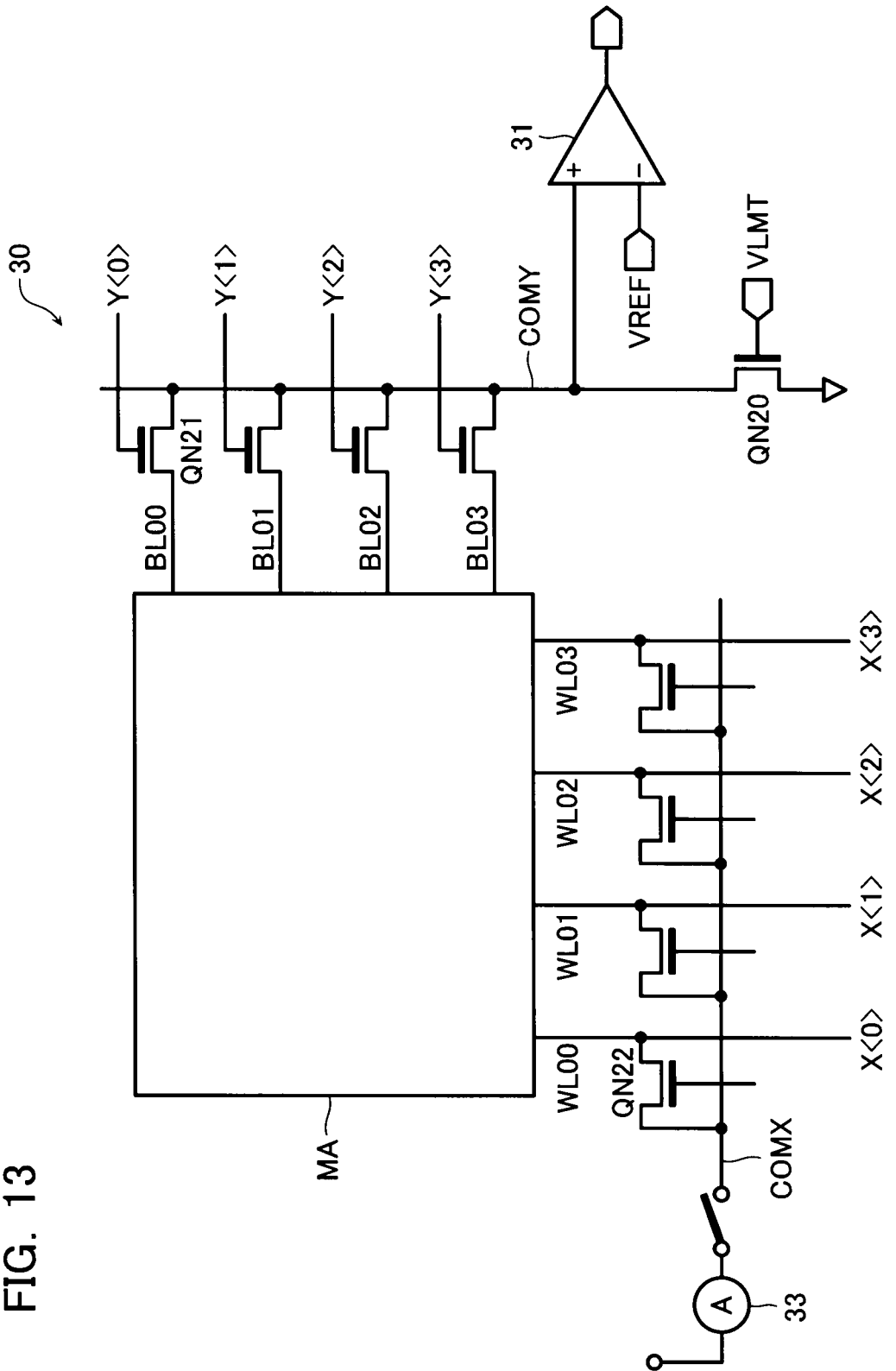
FIG. 13 is a circuit diagram showing as an example the structure of the short-circuit failure detecting circuit 30.

In the short-circuit failure detecting circuit 30 of FIG. 13, the current detector 33 detects whether the current flows through the word line WL, and the differential amplifier 31 detects whether the voltage at the bit line BL is raised larger than a predetermined value.

Figure 14:
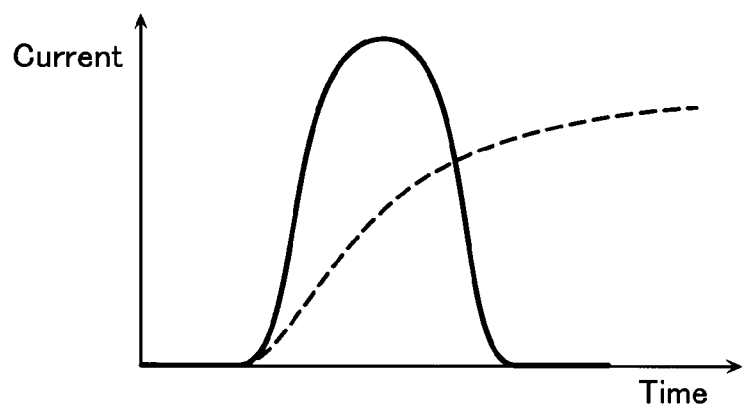
FIG. 14 is a graph representing a change in current with time in a common line COMX in the the short-circuit failure detecting circuit 30.

FIG. 14 is a graph illustrating a time change of the current flowing through the common line COMX, a solid line indicates the case in which the reverse bias is applied to the normal memory cell MC, and a broken line indicates the case in which the reverse bias is applied to the short-circuit failure memory cell MC. In the case in which the reverse bias is applied to the normal memory cell MC, after the current necessary to charge a parasitic capacitance of the word line WL or other parasitic capacitances is passed, the current is decreased and only the leak current is finally left. On the other hand, in the case in which the reverse bias is applied to the short-circuit failure memory cell MC, a constant current is continuously passed because the rectifying action of the diode Di is eliminated. The current detector 33 detects the current difference, whereby whether the short-circuit failure memory cell exists can be detected.

Figure 15:
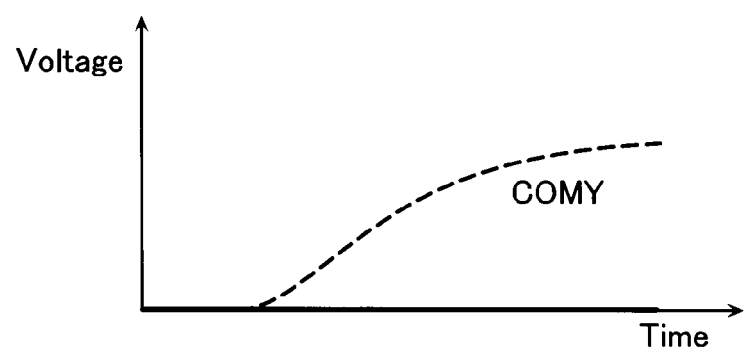
FIG. 15 is a graph representing a change of the voltage with time at a common line COMY in the short-circuit failure detecting circuit 30.
Figure 16:
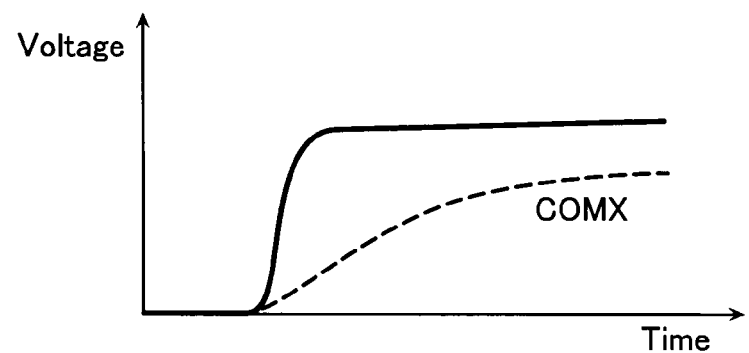
FIG. 16 is a graph representing a change of the voltage of a common line COMX with time in the short-circuit failure detecting circuit 30.

FIG. 15 is a graph illustrating a time change of the voltage at the common line COMX, a solid line indicates the case in which the reverse bias is applied to the normal memory cell MC, and a broken line indicates the case in which the reverse bias is applied to the short-circuit failure memory cell MC. In the case in which the reverse bias is applied to the normal memory cell MC, the voltage at the common line COMY is maintained near 0 V because of the rectifying action of the diode Di. On the other hand, in the case in which the reverse bias is applied to the short-circuit failure memory cell MC, because the rectifying action of the diode Di is eliminated, a constant current is continuously passed, and the voltage is gradually raised according to the passage of the constant current. The differential amplifier 31 detects the change in voltage, whereby whether the short-circuit failure memory cell exists can be detected. Instead of the detection of the change in potential at the common line COMY, or at the same time as the change in potential at the common line COMY is detected, the change in potential at the common line COMX may be detected as shown in FIG. 16.

The switching signals X<0> to <3> and Y<0> to <3> are simultaneously caused to rise to bring the bit line connecting transistor QN21 and the word line connecting transistor QN22 into conduction, whereby whether the short-circuit failure memory cell exists in one memory cell array may be detected by the one-time operation.

Alternatively, the switching signals X<0> to <3> and Y<0> to <3> may be caused to rise in time series to test the memory cell one by one. Alternatively, only some of the plural word lines and bit lines may simultaneously be caused to rise in one memory cell array to test plural memory cells located in the intersections thereof. When the short-circuit failure detecting circuit 30 determines that the short-circuit failure is generated in the memory cell MC, a failure repairing operation is performed to the memory cell MC based on a redundancy substituting circuit (not shown). An address of the memory cell MC to be determined as the short-circuit failure is stored, and the memory cell MC is excluded from the subsequent data write target. The method for repairing the failure of the cell array is coarsely divided into a so-called dispersion redundancy repairing method in which a substituting cell array is disposed in one cell array and a so-called concentration redundancy repairing method in which a dedicated substituting cell array is separately provided. In the concentration redundancy repairing method, it is necessary to provide a dedicated substituting array independently of the normal cell array, and the control circuit becomes complicated. However, the concentration redundancy method usually has the high repair efficiency and a chip yield can be improved.

Figure 17:
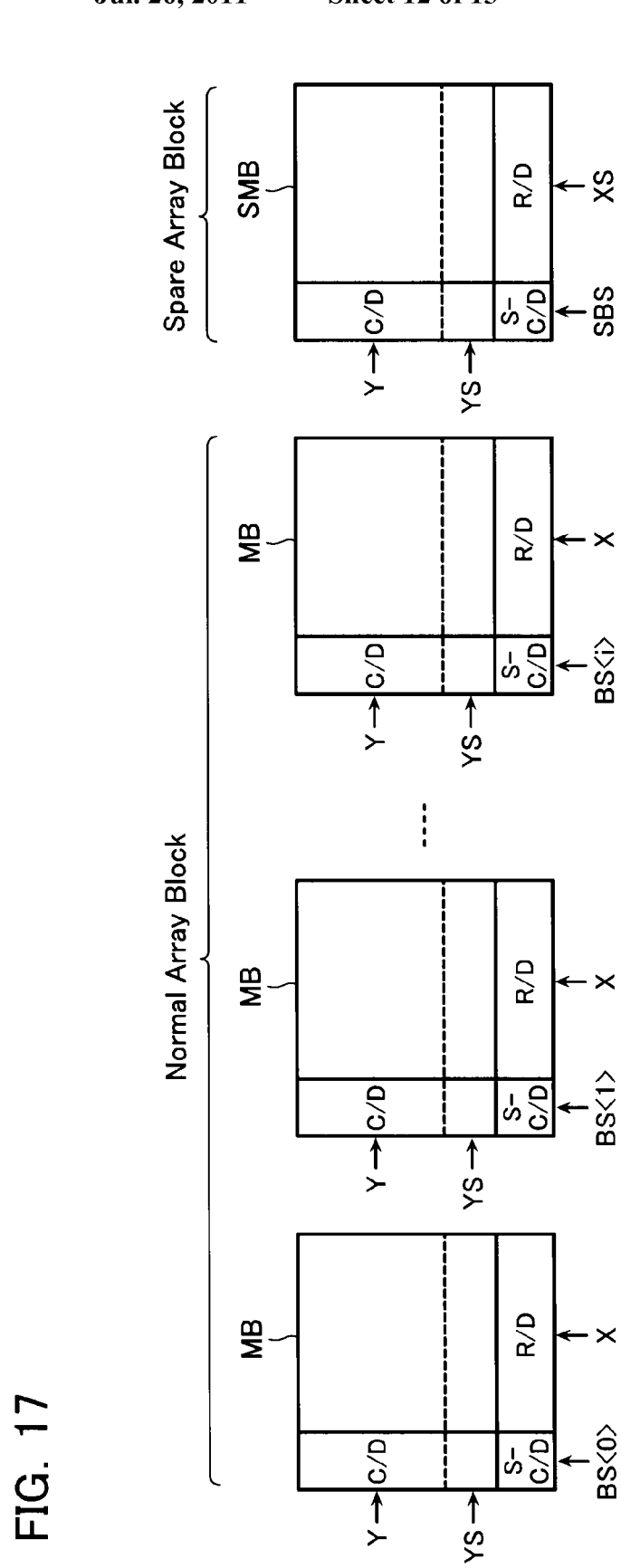
FIG. 17 is a concept diagram showing an example where the concentration redundancy repairing method is adopted for the row redundancy while the dispersion redundancy repairing method is adopted for the column redundancy.

Different repairing methods may be adopted in the row direction and in the column direction. For example, as illustrated in FIG. 17, the concentration redundancy repairing method may be adopted in the row redundancy while the dispersion redundancy repairing method is adopted in the column redundancy.

In cases where the row redundancy repair is performed, a block selection signal BS of a memory cell block MB1 in which the short-circuit failure memory cell is disposed is set in the non-selected state, while a redundancy array block selection signal SBS is set in the selected state, and an access is gained to a memory cell of a redundancy array SMB.

In cases where the column redundancy repair is performed, a column redundancy address signal YS is set in the selected state, and an access is gained to the column redundancy memory cell in each cell array. At this point, preferably a normal address signal Y is forcedly switched to the non-selected state when it is detected that the column redundancy address signal YS is in the selected state.

As described above, the memory cell MC determined as the short-circuit failure is programmed such that the variable resistive element VR becomes the high-resistance state (short-circuit failure countermeasure program). The row control circuit and the column control circuit perform the program operation in the substantially same way as the normal data write operation. Preferably a program condition dedicated to the short-circuit failure countermeasure program is used separately from the normal data write operation. This is attributed to the fact that, because the short-circuit failure of the diode Di is generated in the short-circuit failure memory cell MC, the voltage applied to the variable resistive element VR is larger than that of the normal data write operation by the forward voltage of the diode. In order to correct the forward voltage of the diode, the limit voltage Vclamp applied to the gate of the limit transistor QN17 of FIG. 9 is reduced smaller than that of the normal data write operation in the short-circuit failure countermeasure program. Instead of the adjustment of the limit voltage, a current-limiting circuit may be provided to obtain the similar effect.

All the memory cells MC determined as the short-circuit failure by the above-described technique may be set at the target of the short-circuit failure countermeasure program. Alternatively, the short-circuit failure memory cell MC in which the high resistance value is already given to the variable resistive element VR may be excluded from the target of the short-circuit failure countermeasure program.

Figure 18:
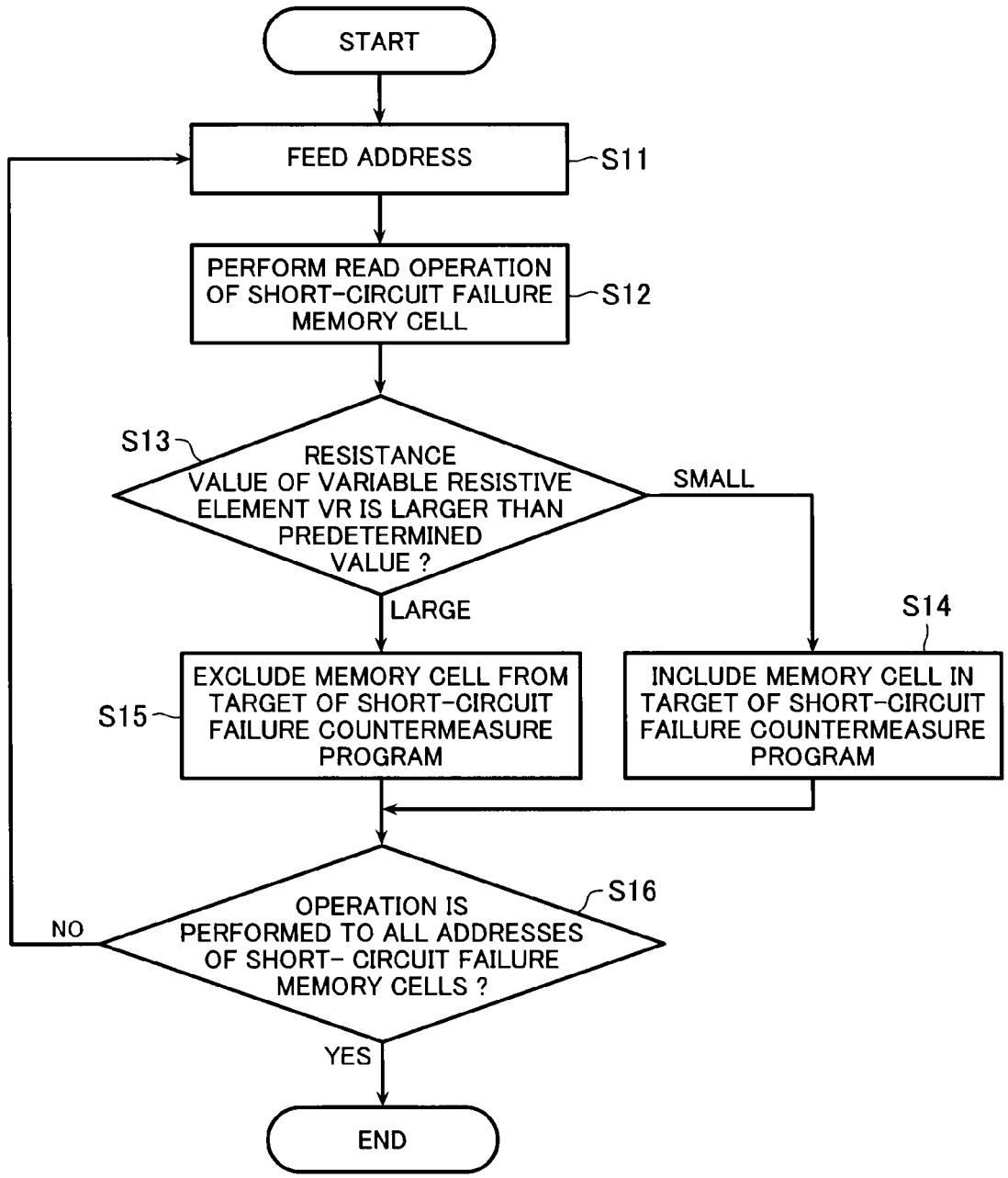
FIG. 18 is a flowchart showing operation concerning a short-circuit failure countermeasure program.

That is, as illustrated in FIG. 18, at a stage before the short-circuit failure countermeasure program is executed, an address of the short-circuit failure memory cell MC is fed (S11), and the read operation of the memory cell MC is performed (S12). Through the read operation, a determination whether the resistance value of the variable resistive element VR in the memory cell MC is larger than a predetermined value is made based on the voltage value detected by the sense amplifier circuit (S13).

When the resistance value of the variable resistive element VR is smaller than the predetermined value, the memory cell MC is included in the target of the short-circuit failure countermeasure program (S14). On the other hand, when the resistance value of the variable resistive element VR is equal to or larger than the predetermined value, the memory cell MC is excluded from the target of the short-circuit failure countermeasure program (S15). The operation is repeatedly performed to all the addresses of the short-circuit failure memory cells MC (S16). As a result of the operation, among the memory cells determined as the short-circuit failure, the short-circuit failure countermeasure program is executed only to the memory cells whose variable resistive element has the resistance value smaller than the predetermined value. The voltage application based on the short-circuit failure countermeasure program is not performed to the short-circuit failure memory cell MC in which the resistance value of the variable resistive element VR is already larger than the predetermined value. Therefore, the shortening of the operation time and reduction of power consumption can be achieved, and a write error caused by unnecessary voltage application can be prevented.

Thus, the embodiment of the invention is described. The invention is not limited to the embodiment, but various changes, substitutions, additions, and deletions can be made without departing from the scope of the invention. In the embodiment, the binary data (one-bit data) is stored in one memory cell. However, the invention is not limited to the embodiment. For example, the invention can also be applied to a so-called multi-value storage type memory device in which data of at least two bits is stored in one memory cell. In such cases, preferably the short-circuit failure memory cell is programmed to the highest resistance value of the variable resistive element.

What is claimed is:

1. A semiconductor memory device comprising:
a memory cell array having memory cells arranged at intersections of a plurality of first wirings and a plurality of second wirings, a rectifying element and a variable resistive element being connected in series in the memory cell, the variable resistive element having at least a first resistance value and a second resistance value that is higher than the first resistance value, each of the memory cells including the rectifying element and the variable resistive element connected in a fixed manner irrespective of whether the variable resistive element is the first resistance value or the second resistance value; and
a control circuit selectively driving the first wirings and the second wirings,
the control circuit being capable of performing a short-circuit failure countermeasure program operation in which the variable resistive element of the memory cell whose rectifying element is in a short-circuit failure state is programmed from the first resistance value to the second resistance value, and
the short-circuit failure countermeasure program operation is configured such that a first voltage is applied to either the first wirings or the second wirings while applying a second voltage to the other, the second voltage being lower than the first voltage and having the same polarity of the first voltage, or being ground voltage.

2. The semiconductor memory device according to claim 1, wherein the second resistance value is the highest resistance value in resistance values that can be possessed by the variable resistive element in a normal write operation performed to the memory cell.

3. The semiconductor memory device according to claim 2, wherein the short-circuit failure countermeasure program operation is performed only to the memory cell whose variable resistive element has a resistance value smaller than a predetermined value, out of memory cells determined as in the short-circuit failure state.

4. The semiconductor memory device according to claim 2, wherein a voltage applied to the memory cell in the short-circuit failure countermeasure program operation is smaller than a voltage applied to the memory cell in the normal write operation.

5. The semiconductor memory device according to claim 4, wherein the short-circuit failure countermeasure program operation is performed only to the memory cell whose variable resistive element has a resistance value smaller than a predetermined value, out of memory cells determined as the short-circuit failure state.

6. The semiconductor memory device according to claim 1, wherein a voltage applied to the memory cell in the short-circuit failure countermeasure program operation is smaller than a voltage applied to the memory cell in the normal write operation.

7. The semiconductor memory device according to claim 6, further comprising a limit transistor having one end connected to the first wiring and a gate provided with a limit voltage to limit a voltage supplied to the first wiring,
wherein the limit voltage used in performing the short-circuit failure countermeasure program operation is smaller than the limit voltage used in performing the normal write operation.

8. The semiconductor memory device according to claim 1, wherein the short-circuit failure countermeasure program operation is performed only to the memory cell whose variable resistive element has a resistance value smaller than a predetermined value, out of memory cells determined as the short-circuit failure state.

9. The semiconductor memory device according to claim 8, wherein, in the short-circuit failure countermeasure program operation, the normal read operation to the memory cells is conducted to detect the memory cell whose variable resistive element has a resistance value smaller than a predetermined value.

10. The semiconductor memory device according to claim 1, further comprising a detection circuit, the detection circuit applying a voltage to the memory cell such that a reverse bias is applied to the rectifying element, detecting whether a current flows through the memory cell, and detecting the memory cell in the short-circuit failure state.

11. The semiconductor memory device according to claim 10, wherein the detection circuit applies a voltage to the first wiring and the second wiring such that a reverse bias is applied to the rectifying element, and the detection circuit detects the memory cell in the short-circuit failure state based on a change in voltage of the first wiring or the second wiring.

12. The semiconductor memory device according to claim 10, wherein the control circuit performs the short-circuit failure countermeasure program operation only to the memory cell whose variable resistive element has a resistance value smaller than a predetermined value, out of memory cells determined as the short-circuit failure state.

13. The semiconductor memory device according to claim 10, wherein a voltage applied to the memory cell in the short-circuit failure countermeasure program operation is smaller than a voltage applied to the memory cell in the normal write operation.

14. A method for repairing redundancy of a semiconductor memory device including a memory cell array having memory cells arranged at intersections of a plurality of first wirings and a plurality of second wirings, a rectifying element and a variable resistive element being connected in series in the memory cell, the variable resistive element having at least a first resistance value and a second resistance value that is higher than the first resistance value, each of the memory cells including the rectifying element and the variable resistive element connected in a fixed manner irrespective of whether the variable resistive element is the first resistance value or the second resistance value, the redundancy repairing method comprising:
detecting the memory cell whose rectifying element is in a short-circuit failure state; and
programming the variable resistive element of the memory cell whose rectifying element is in a short-circuit failure state from the first resistance value to the second resistance value by performing a short-circuit failure countermeasure program operation, the short-circuit failure countermeasure program operation being configured such that a first voltage is applied to either the first wirings or the second wirings while applying a second voltage to the other, the second voltage being lower than the first voltage and having the samepolarity of the first voltage, or being ground voltage.

15. The redundancy repairing method according to claim 14, wherein a voltage is applied to the memory cell such that a reverse bias is applied to the rectifying element, and whether the rectifying element is in the short-circuit failure state is detected based on whether a current flows through the memory cell.

16. The redundancy repairing method according to claim 14, wherein a voltage applied to the memory cell in the short-circuit failure countermeasure program operation is smaller than a voltage applied to the memory cell in a normal write operation.

17. The redundancy repairing method according to claim 14, wherein the short-circuit failure countermeasure program operation is performed only to the memory cell whose variable resistive element has a resistance value smaller than a predetermined value, out of memory cells determined as the short-circuit failure state.

18. The redundancy repairing method according to claim 14, wherein the second resistance value is the highest resistance value in resistance values that can be possessed by the variable resistive element in a normal write operation performed to the memory cell.

19. The redundancy repairing method according to claim 18, wherein the short-circuit failure countermeasure program operation is performed only to the memory cell whose variable resistive element has a resistance value smaller than a predetermined value, out of memory cells determined as the short-circuit failure state.

* * * * *